US011916041B2

(12) United States Patent
Liao

(10) Patent No.: US 11,916,041 B2
(45) Date of Patent: *Feb. 27, 2024

(54) METHOD FOR REPAIRING A LIGHT-EMITTING DEVICE AND A METHOD FOR MANUFACTURING AN LED PANEL

(71) Applicant: ASTI GLOBAL INC., TAIWAN, Taichung (TW)

(72) Inventor: Chien-Shou Liao, Taichung (TW)

(73) Assignee: ASTI GLOBAL INC., TAIWAN, Taichung (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/677,853

(22) Filed: Feb. 22, 2022

(65) Prior Publication Data
US 2022/0181293 A1    Jun. 9, 2022

Related U.S. Application Data

(63) Continuation-in-part of application No. 16/535,211, filed on Aug. 8, 2019, now Pat. No. 11,304,349.

(30) Foreign Application Priority Data

Jan. 4, 2019 (TW) ................................ 108100396

(51) Int. Cl.
    *H01L 23/00* (2006.01)
    *H01L 25/16* (2023.01)

(52) U.S. Cl.
    CPC .............. *H01L 24/83* (2013.01); *H01L 24/81* (2013.01); *H01L 25/167* (2013.01); *H01L 24/27* (2013.01); *H01L 2224/27422* (2013.01); *H01L 2224/81143* (2013.01); *H01L 2224/81815* (2013.01); *H01L 2224/83052* (2013.01); *H01L 2224/83191* (2013.01); *H01L 2224/83224* (2013.01); *H01L 2224/83424* (2013.01); *H01L 2224/83444* (2013.01); *H01L 2224/83815* (2013.01); *H01L 2224/83908* (2013.01)

(58) Field of Classification Search
    CPC ....... H01L 21/6835; H01L 2221/68322; H01L 2221/68354; H01L 2221/68381; H01L 2224/16225; H01L 2224/27422
    See application file for complete search history.

(56) References Cited

U.S. PATENT DOCUMENTS

| 11,304,349 | B2* | 4/2022 | Liao | ................... | H05K 13/0486 |
| 2018/0309019 | A1* | 10/2018 | Liao | ........................ | H01L 25/50 |
| 2022/0181293 | A1* | 6/2022 | Liao | ........................ | H01L 24/83 |

* cited by examiner

Primary Examiner — Minh N Trinh
(74) Attorney, Agent, or Firm — JCIPRNET

(57) ABSTRACT

A method for repairing a light-emitting device, which comprises a plurality of light-emitting units disposed on a circuit substrate with at least one of the plurality of light-emitting units being damaged. The method for repairing a light-emitting device including the following steps is provided: removing the at least one damaged light-emitting unit from the circuit substrate to form an unoccupied position on the circuit substrate; providing a good light-emitting unit on a bottom of which a volatile adhesive material has been applied; using a pick and place module to place the good light-emitting unit at the unoccupied position on the circuit substrate; and melting and solidifying the volatile adhesive material so that the good light-emitting unit is affixed at the unoccupied position.

9 Claims, 13 Drawing Sheets

METHOD FOR REPAIRING A LIGHT-EMITTING DEVICE AND A METHOD FOR MANUFACTURING AN LED PANEL

CROSS-REFERENCE TO RELATED APPLICATION

This application is a continuation-in-part application of and claims the priority benefit of U.S. application Ser. No. 16/535,211, filed on Aug. 8, 2019, now patented as U.S. Pat. No. 11,304,349 B2, issued on Apr. 12, 2022, which claims the priority benefit of Taiwan application serial no. 108100396, filed on Jan. 4, 2019. The entirety of each of the above-mentioned patent applications is hereby incorporated by reference herein and made a part of this specification.

BACKGROUND

Technical Field

The present disclosure relates to a repair method and a manufacturing method, and more particularly to a method for repairing a light-emitting device and a method for manufacturing an LED panel.

Description of Related Art

Light-emitting diodes (LED) are widely used nowadays due to their excellent light quality and high luminous efficiency. Generally, in order for a display device using a light-emitting diode as a light-emitting element to have better color performance, a conventional display device adopts a combination of red, green, and blue light-emitting diode chips to form a full color light-emitting diode display device. The full-color light-emitting diode display device can respectively emit three colors of red, green and blue light through three kinds of red, green and blue light-emitting diode chips, so that a full-color light is formed to display relevant information after the mixing of light. However, in the related art, when the LED chip fixed onto the circuit substrate is damaged, the damaged LED chip can no longer be repaired.

SUMMARY

The disclosure provides a method for repairing a light-emitting device and a method for manufacturing an LED panel.

A method for repairing a light-emitting device including a plurality of light-emitting units disposed on a circuit substrate with at least one of the plurality of light-emitting units being damaged including the following steps is provided: removing the at least one damaged light-emitting unit from the circuit substrate to form an unoccupied position on the circuit substrate; providing a good light-emitting unit on a bottom of which a first volatile adhesive material has been applied; using a pick and place module to place the good light-emitting unit at the unoccupied position on the circuit substrate; and melting and solidifying the first volatile adhesive material so that the good light-emitting unit is affixed at the unoccupied position.

A method for manufacturing an LED panel including the following steps is provided: providing a circuit substrate and a plurality of LED chips; applying a flux onto the circuit substrate; using a second volatile adhesive material to affix the plurality of LED chips onto the circuit substrate; and optionally, repairing the LED panel thus formed according to the method for repairing a light-emitting device aforementioned.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The present disclosure is more particularly described in the following examples that are intended as illustrative only since numerous modifications and variations therein will be apparent to those skilled in the art. The same or similar reference numbers represent the same or similar elements, and details are not repeated in the following paragraphs. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a method for repairing a damaged light-emitting unit in a light-emitting device of a first embodiment including the following steps is provided.

Figure 1:
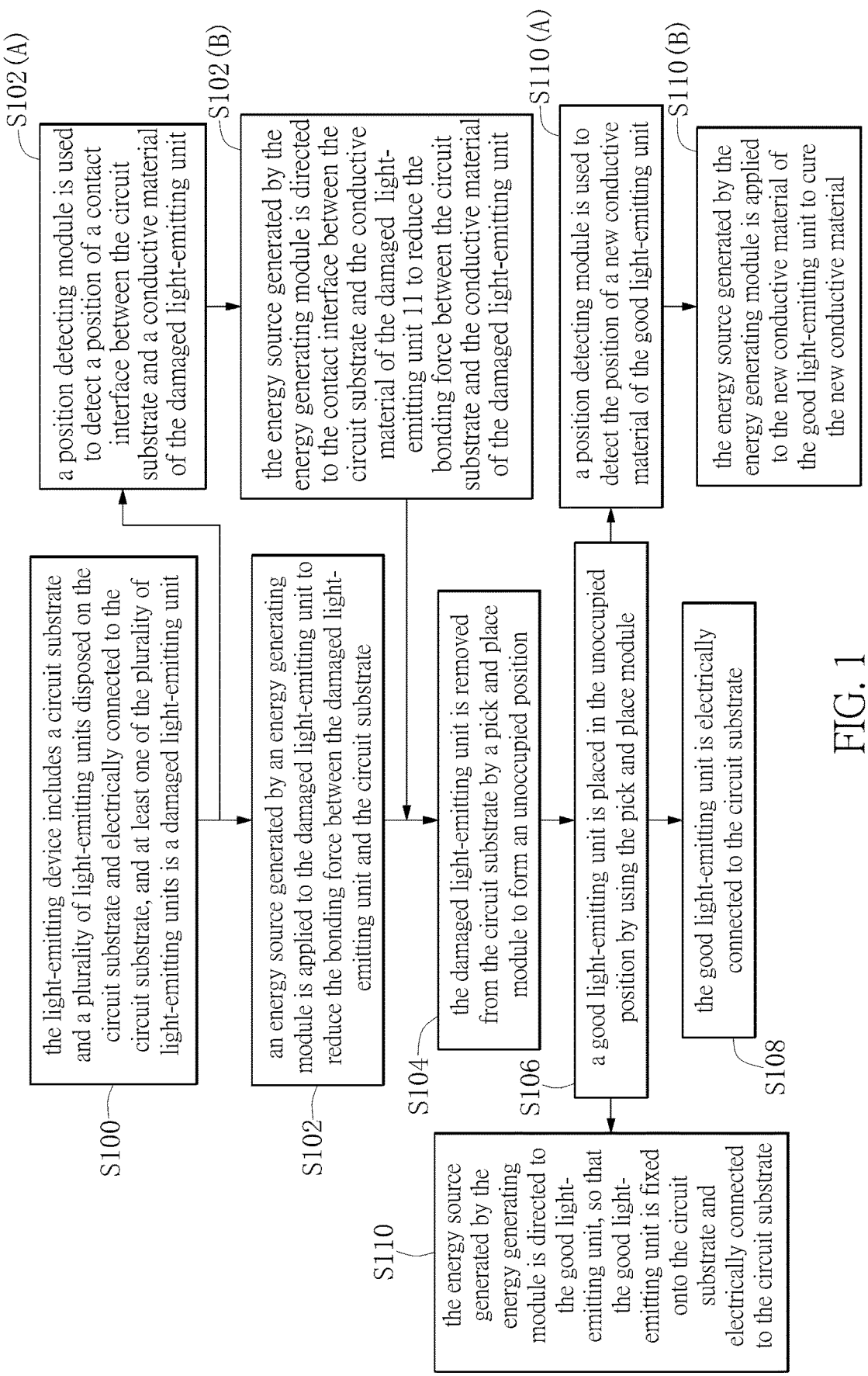
FIG. 1 is a flow chart of a method for repairing a light-emitting device according to a first embodiment of the present disclosure.
Figure 2:
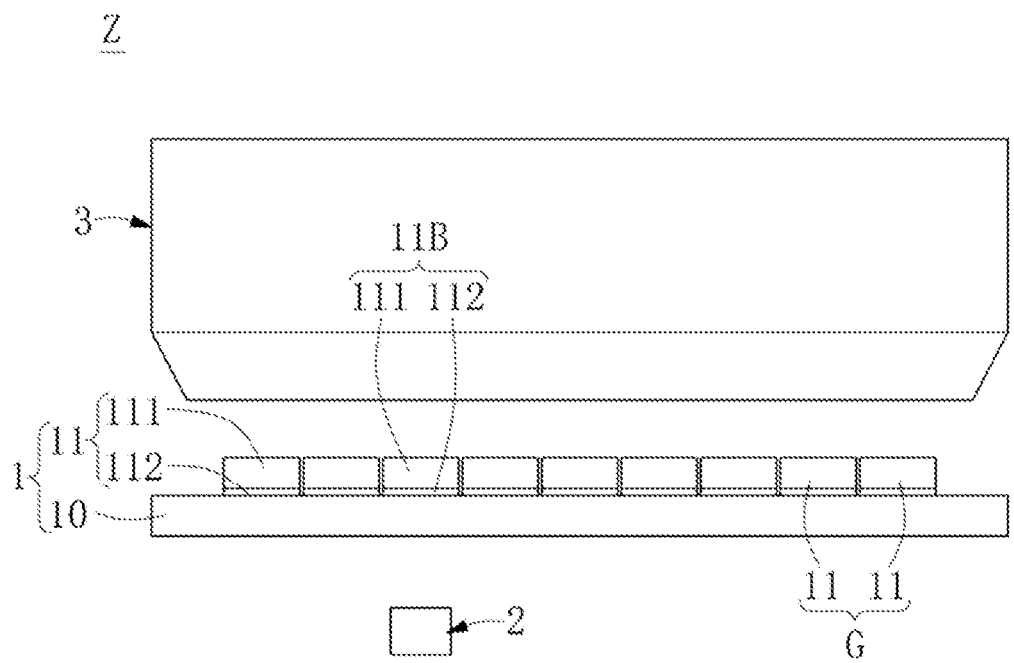
FIG. 2 is a schematic view of a step S100 of the method for repairing a light-emitting device according to the first embodiment of the present disclosure.

First, as shown in FIG. 1 and FIG. 2, a light-emitting device 1 is provided. The light-emitting device 1 includes a circuit substrate 10 and a plurality of light-emitting units 11 disposed on the circuit substrate 10 and electrically connected to the circuit substrate 10, and at least one of the plurality of light-emitting units 11 is a damaged light-emitting unit 11B (step S100). In other words, the light-emitting device 1 includes a circuit substrate 10 and a light-emitting group G disposed on the circuit substrate 10 and electrically connected to the circuit substrate 10, and the light-emitting group G includes a plurality of light-emitting units 11.

For example, each light-emitting unit 11 includes an LED chip 111 and a conductive material 112 disposed between the bottom end of the LED chip 111 and the circuit substrate 10. That is, the light-emitting device 1 may be referred to as an LED module or a portion of an LED module. In addition, the LED chip 111 may be a gallium nitride LED chip (GaN LED). In other words, the LED chip 111 may be a semiconductor chip. In addition, the conductive material 112 may include an anisotropic conductive film (ACF), an anisotropic conductive paste (ACP), a volatile conductive adhesive material, or any kind of conductive material. Before the LED chip 111 and the circuit substrate 10 are electrically connected to each other, the conductive material 112 may be disposed on the bottom of the LED chip 111 and/or on the circuit substrate 10. It should be noted that the damaged light-emitting unit 11B may result in a situation where the LED chip 111 is damaged and cannot provide a light source, or a situation where the conductive material 112 is incapable of conducting electricity so as to cause electrical failure.

Figure 3:
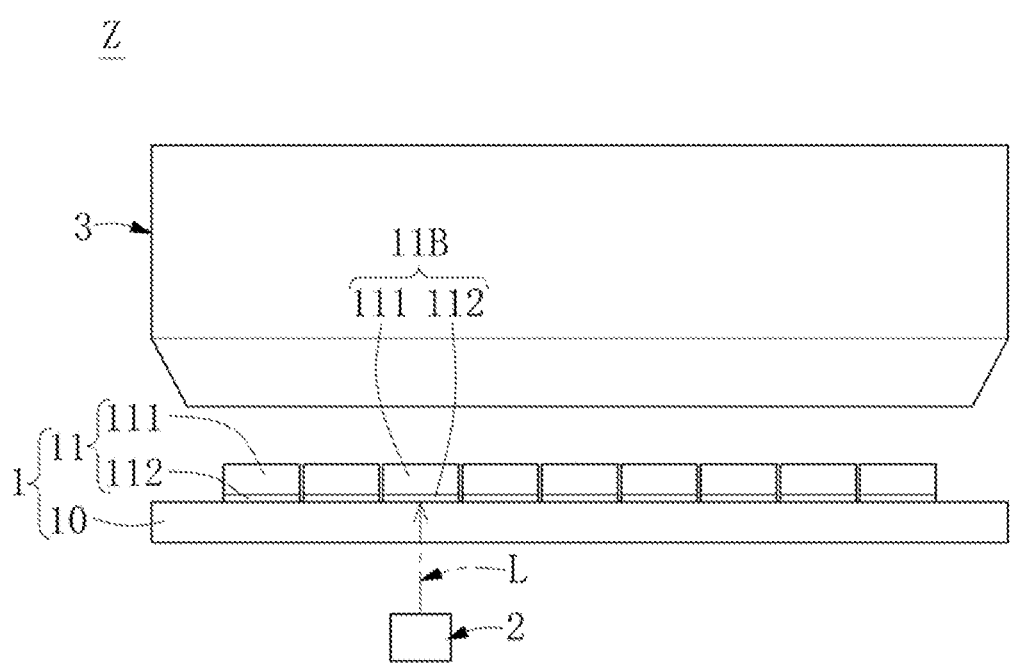
FIG. 3 is a schematic view of a step S102 and step S102 (B) of the method for repairing a light-emitting device according to the first embodiment of the present disclosure.

Next, as shown in FIG. 1 and FIG. 3, an energy source L generated by an energy generating module 2 is applied to the damaged light-emitting unit 11B to reduce the bonding force between the damaged light-emitting unit 11B and the circuit substrate 10 (step S102). The energy source L may be a laser source, and the generating module 2 may be a laser generating module. For example, when the energy source L generated by the energy generating module 2 is directed to the damaged light-emitting unit 11B, the bonding force between the damaged light-emitting unit 11B and the circuit substrate 10 is reduced, so that both the damaged light-emitting unit 11B and the circuit substrate 10 are separated from each other.

Figure 4:
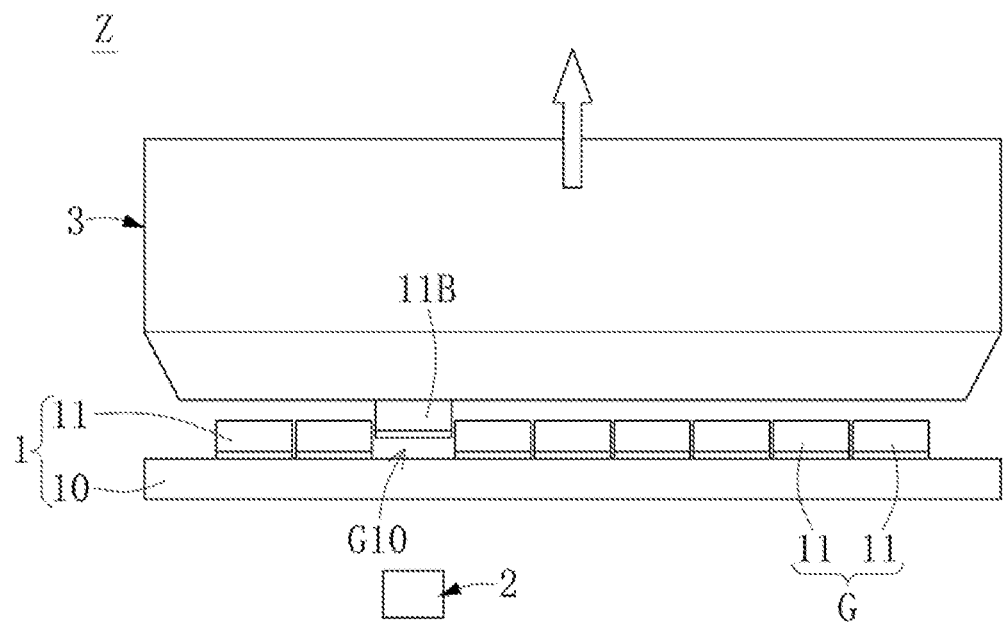
FIG. 4 is a schematic view of a step S104 of the method for repairing a light-emitting device according to the first embodiment of the present disclosure.

Then, as shown in FIG. 1 and FIG. 4, the damaged light-emitting unit 11B is removed from the circuit substrate 10 by a pick and place module 3 to form an unoccupied position G10 (step S104), or the damaged light-emitting unit 11B is removed from the circuit substrate 10 by using the pick and place module 3 so that a light-emitting group G forms an unoccupied position G10. For example, the pick and place module 3 may be a vacuum nozzle or any kind of pick and place machine.

Figure 5:
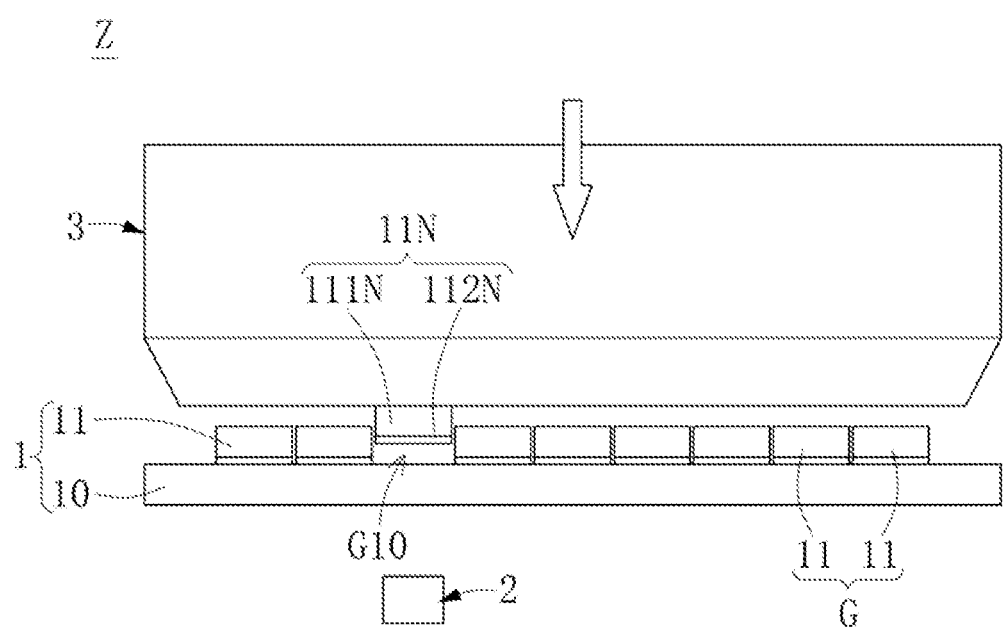
FIG. 5 is a schematic view of a step S106 of the method for repairing a light-emitting device according to the first embodiment of the present disclosure.

Next, as shown in FIG. 1 and FIG. 5, a good light-emitting unit 11N (e.g., an intact light-emitting unit) is placed in the unoccupied position G10 by using the pick and place module 3 (step S106), or a good light-emitting unit 11N is placed in the unoccupied position G10 of the light-emitting group G by using the pick and place module 3. For example, the good light-emitting unit 11N includes a good LED chip 111N and a new conductive material 112N disposed on the bottom end of the good LED chip 111N, and the new conductive material 112N may be an anisotropic conductive paste or any kind of conductive material.

Figure 6:
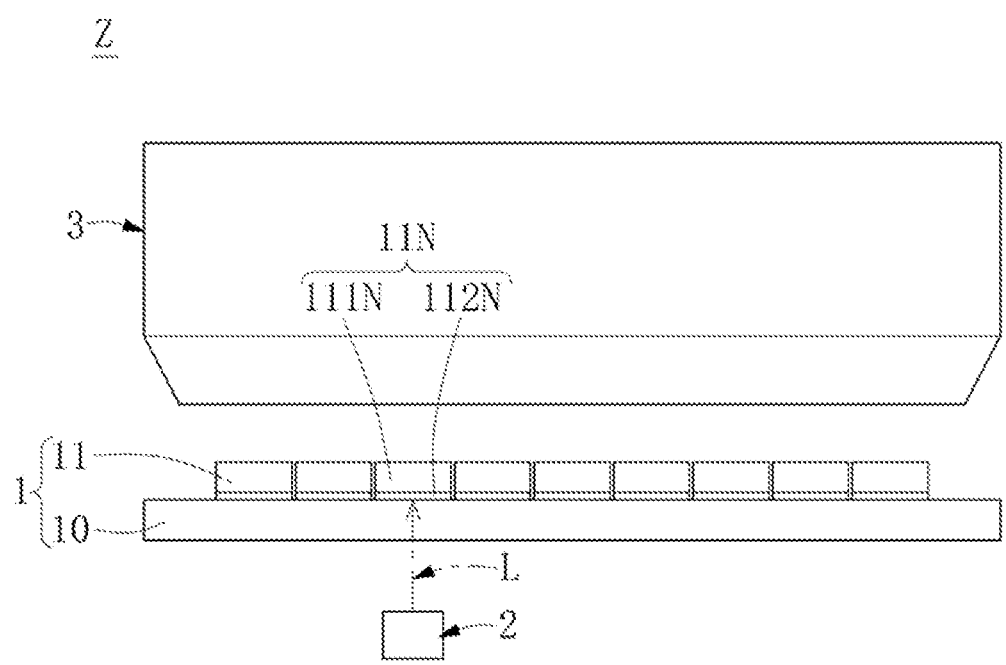
FIG. 6 is a schematic view of a step S108, step S110 and step S110 (B) of the method for repairing a light-emitting device according to the first embodiment of the present disclosure.

Then, as shown in FIG. 1 and FIG. 6, the good light-emitting unit 11N is electrically connected to the circuit substrate 10 (step S108). For example, in the step of the good light-emitting unit 11N being electrically connected to the circuit substrate 10 (step S108), the method may further include the following step: directing the energy source L generated by the energy generating module 2 to the good light-emitting unit 11N, so that the good light-emitting unit 11N is fixed onto the circuit substrate 10 and electrically connected to the circuit substrate 10 (step S110).

Figure 7:
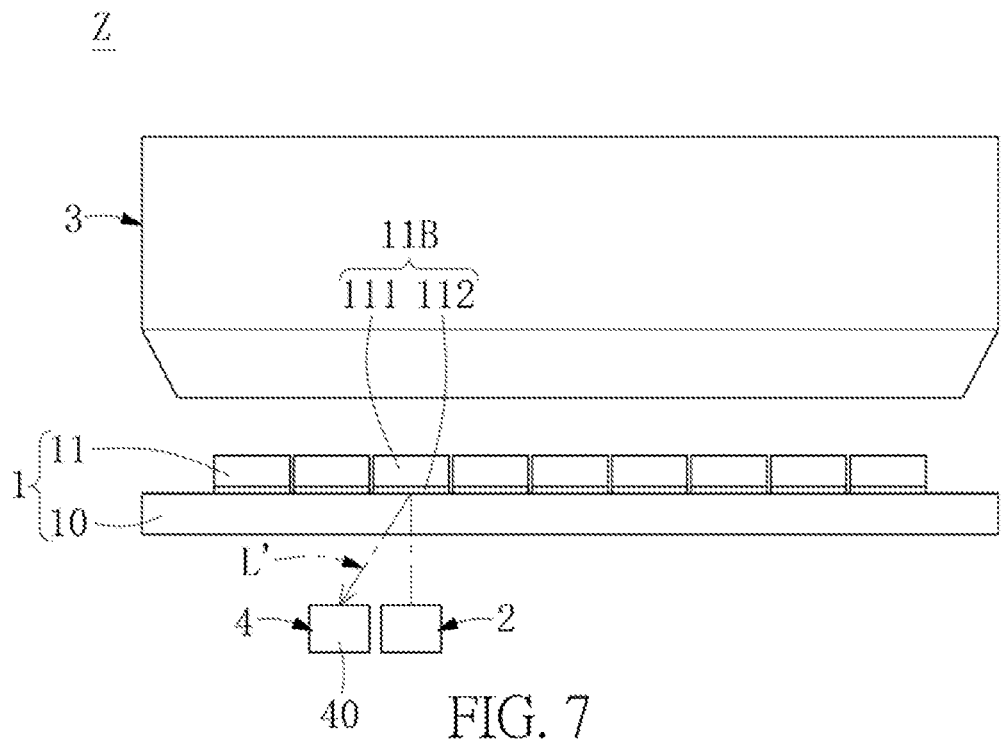
FIG. 7 is a schematic view of a step S102 (A) of the method for repairing a light-emitting device according to the first embodiment of the present disclosure.

Further, for example, as shown in FIG. 1, FIG. 3 and FIG. 7, in the step of directing the energy source L generated by the energy generating module 2 to the damaged light-emitting unit 11B (step S102), the method may further include the following step: as shown in FIG. 1 and FIG. 7, using a position detecting module 4 to detect a position of a contact interface between the circuit substrate 10 and a conductive material 112 of the damaged light-emitting unit 11B (step S102 (A)); then, as shown in FIG. 1 and FIG. 3, directing the energy source L generated by the energy generating module 2 to the contact interface between the circuit substrate 10 and the conductive material 112 of the damaged light-emitting unit 11B to reduce the bonding force between the circuit substrate 10 and the conductive material 112 of the damaged light-emitting unit 11B (step S102 (B)).

For example, as shown in FIG. 7, the position detecting module 4 includes at least one receiving element 40 for receiving a detection wave L', and the detecting wave L' may be provided by the energy generating module 2.

Figure 8:
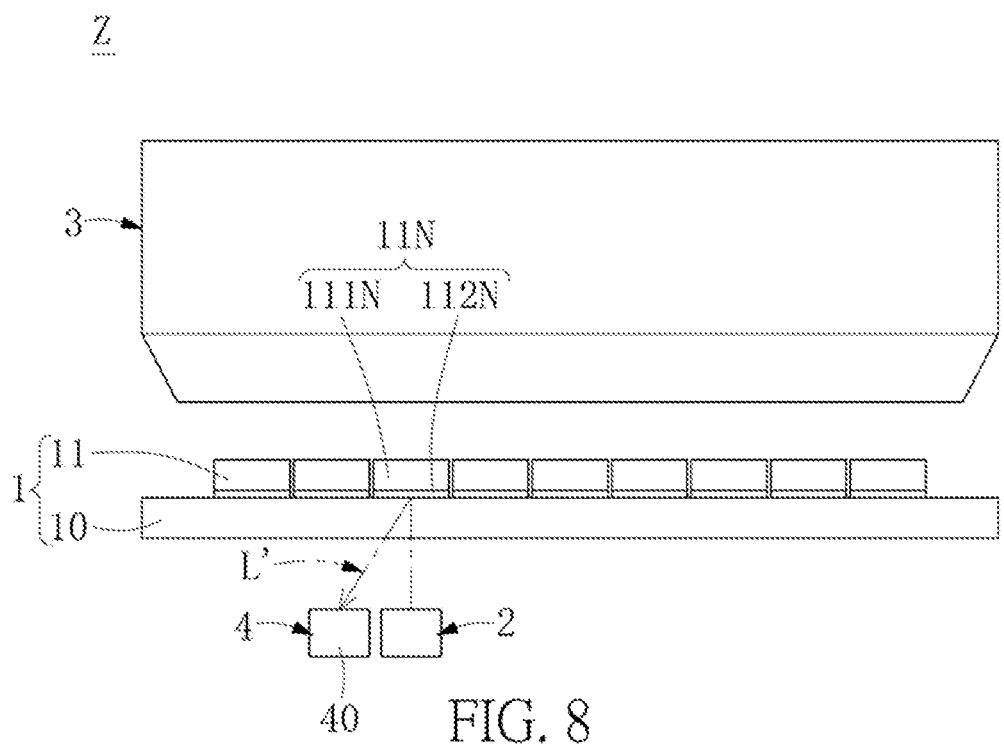
FIG. 8 is a schematic view of a step S110 (A) of the method for repairing a light-emitting device according to the first embodiment of the present disclosure.

Further, for example, as shown in FIG. 1, FIG. 6, and FIG. 8, in the step of directing the energy source L generated by the energy generating module 2 to the good light-emitting unit 11N (step S110), the method may further include the following step: as shown in FIG. 1 and FIG. 8, using a position detecting module 4 to detect the position of a new conductive material 112N of the good light-emitting unit 11N (step S110 (A)); then, as shown in FIG. 1 and FIG. 6, the energy source L generated by the energy generating module 2 is applied to the new conductive material 112N of the good light-emitting unit 11N to cure the new conductive material 112N (step S110 (B)). For example, as shown in FIG. 8, the position detecting module 4 includes at least one receiving element 40 for receiving a detection wave L', and the detecting wave L' may be provided by the energy generating module 2.

It should be noted that, as shown in FIG. 1 to FIG. 8, the first embodiment of the present disclosure may further provide an apparatus for repairing a damaged light-emitting unit Z, and the apparatus for repairing a damaged light-emitting unit Z includes an energy generating module 2 and a pick and place module 3. For example, the apparatus for repairing a damaged light-emitting unit Z may be applied to a light-emitting device 1. The light-emitting device 1 includes a circuit substrate 10 and a plurality of light-emitting units 11 disposed on the circuit substrate 10 and electrically connected to the circuit substrate 10, and at least one of the plurality of light-emitting units 11 is a damaged light-emitting unit 11B.

Furthermore, as shown in FIG. 3 and FIG. 6, the energy generating module 2 is adjacent to the circuit substrate 10 and disposed under the circuit substrate 10 (which may also be placed above) for generating an energy source L.

For example, as shown in FIG. 3, the energy source L generated by the energy generating module 2 may be directed to the damaged light-emitting unit 11B to reduce the bonding force between the damaged light-emitting unit 11B and the circuit substrate 10. That is, the energy source L generated by the energy generating module 2 may be directed to the contact interface between the circuit substrate 10 and the conductive material 112 of the damaged light-emitting unit 11B to reduce the bonding force between the circuit substrate 10 and the conductive material 112 of the damaged light-emitting unit 11B.

For example, as shown in FIG. 6, the energy source L generated by the energy generating module 2 may be directed to the good light-emitting unit 11N, so that the good light-emitting unit 11N may be fixed onto the circuit substrate 10 and electrically connected to the circuit substrate 10. In other words, the energy source L generated by the energy generating module 2 may be applied to the new conductive material 112N of the good light-emitting unit 11N to cure the new conductive material 112N, so that the good light-emitting unit 11N may be fixed onto the circuit substrate 10 and electrically connected to the circuit substrate 10. It should be noted that, in the abovementioned embodiment, the wavelengths of the energy source L for bonding the good light-emitting unit 11N to the circuit substrate 10 and the energy source L for reducing the binding force of the damaged light-emitting unit 11B may be the same or may be different from each other.

Furthermore, as shown in FIG. 5 and FIG. 6, the pick and place module 3 is adjacent to the light-emitting unit 11 and disposed above the light-emitting unit 11. For example, the pick and place module 3 may be used to remove the damaged light-emitting unit 11B from the circuit substrate 10 to form an unoccupied position G10 (as shown in FIG. 5), and the pick and place module 3 may be used to place a good light-emitting unit 11N into the unoccupied position G10 (as shown in FIG. 6).

Furthermore, as shown in FIG. 7 and FIG. 8, the apparatus for repairing a damaged light-emitting unit Z may further include a position detecting module 4. The position detecting module 4 is adjacent to the circuit substrate 10 and disposed under the circuit substrate 10 for detecting the position of a contact interface between the circuit substrate 10 and a conductive material 112 of the damaged light-emitting unit 11B, or for detecting the position of a new conductive material 112N of the good light-emitting unit 11N.

Second Embodiment

Referring to FIG. 9 to FIG. 17, a method for repairing a damaged light-emitting unit in a light-emitting device of a second embodiment including the following steps is provided.

Figure 9:
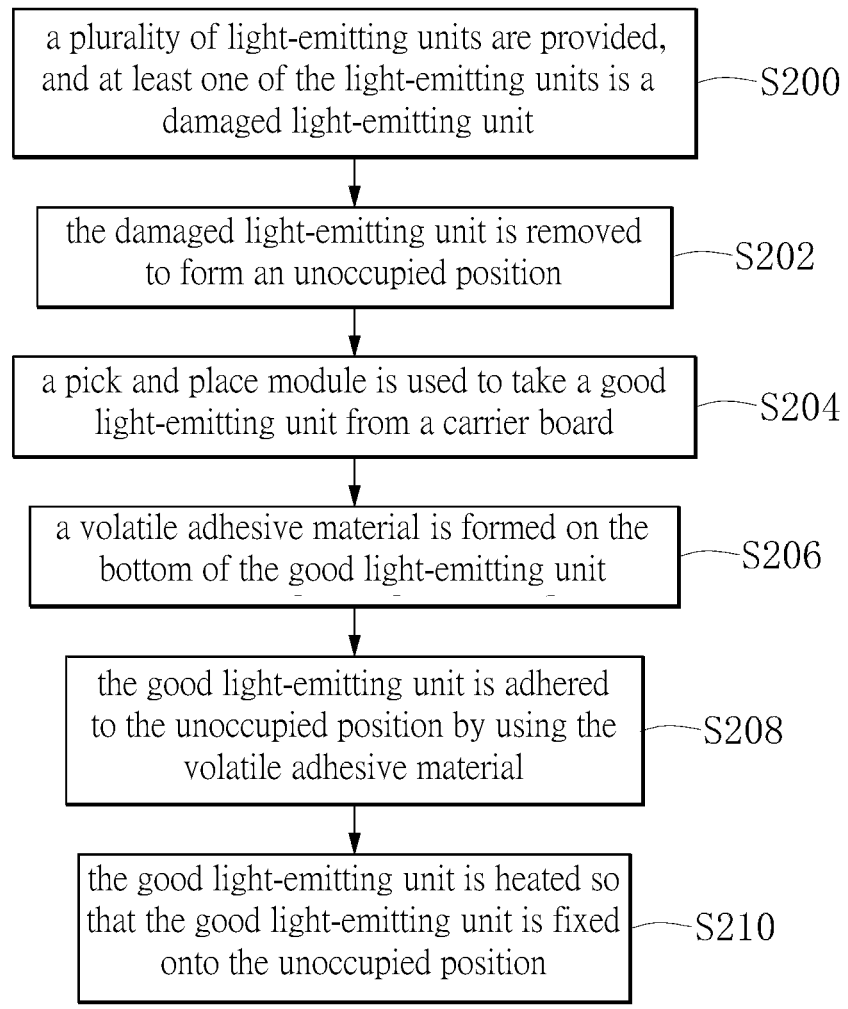
FIG. 9 is a flow chart of a method for repairing a light-emitting device according to a second embodiment of the present disclosure.

First, as shown in FIG. 9 and FIG. 2, a plurality of light-emitting units 11 are provided, and at least one of the light-emitting units is a damaged light-emitting unit 11B (step S200). For example, step S200 of the present embodiment may be similar to step S100 of the first embodiment; that is, a light-emitting device 1 may be provided, and the light-emitting device 1 includes a circuit substrate 10 and a plurality of light-emitting units 11 disposed on the circuit substrate 10 and electrically connected thereto. At least one of the light-emitting units 11 is a damaged light-emitting unit 11B. However, the present disclosure is not limited thereto.

Next, as shown in FIG. 9 and FIGS. 3 and 4, the damaged light-emitting unit 11B is removed to form an unoccupied position G10 (step S202). For example, step S202 of the embodiment may be similar to step S102 and step S104 of the first embodiment; that is, an energy source L generated by an energy generating module 2 may be used to direct to the damaged light-emitting unit 11B to reduce the bonding force between the damaged light-emitting unit 11B and the circuit substrate 10. Next, a pick and place module 3 is used to remove the damaged light-emitting unit 11B from the circuit substrate 10 to form an unoccupied position G10. However, the present disclosure is not limited thereto.

Figure 10:
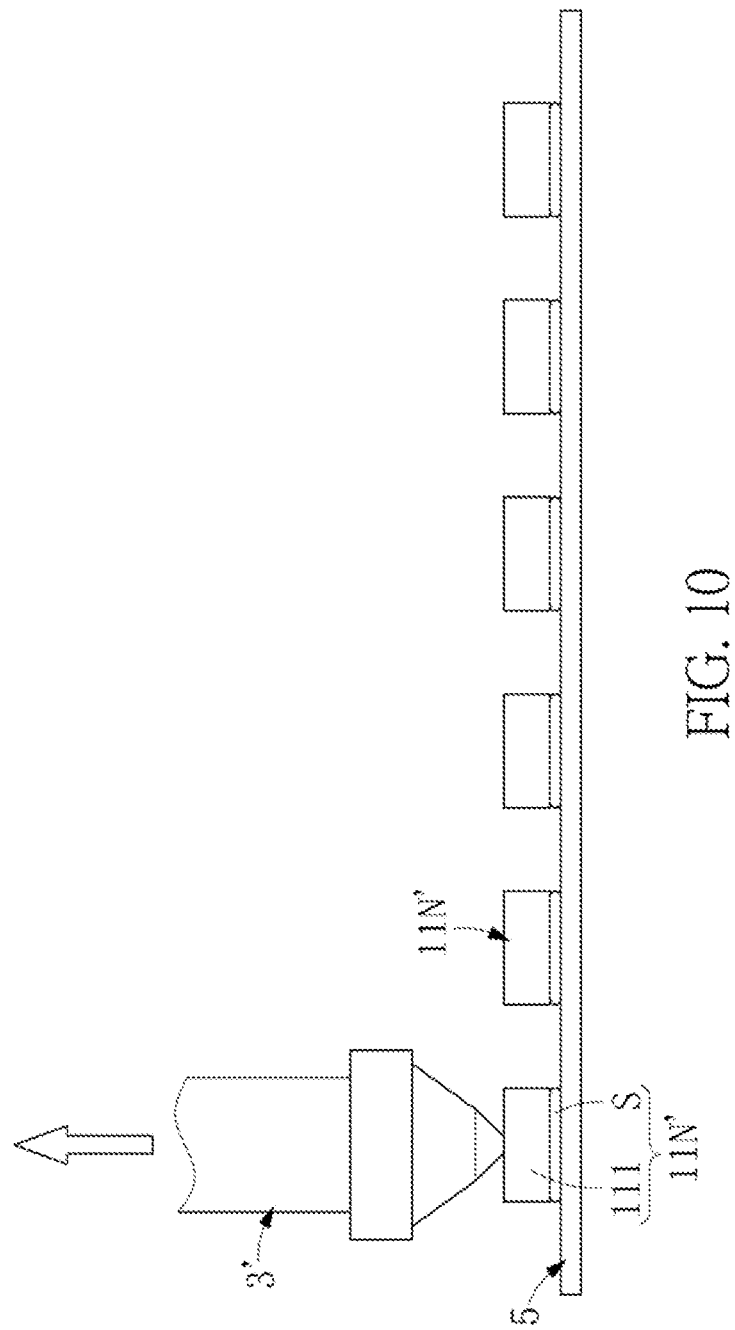
FIG. 10 is a schematic view of a step S204 of the method for repairing a light-emitting device according to the second embodiment of the present disclosure.

Then, as shown in FIG. 9 and FIG. 10, a pick and place module 3' is used to obtain a good light-emitting unit 11N' from a carrier board 5 (step S204). For example, the carrier board 5 (for example, a blue film, but not limited thereto) may carry at least one good light-emitting unit 11N', and the good light-emitting unit 11N' includes an LED chip 111 and a conductive joint S on the bottom end of the LED chip 111. The LED chip 111 may be a gallium nitride LED chip (GaN LED), and a material of the conductive joint S may include tin, lead, silver, antimony, copper, iron, gold, platinum, indium, nickel or an alloy including at least two of the foregoing. The good light-emitting unit 11N is obtained by pick and place module 3. The pick and place module 3 may be a vacuum nozzle or any kind of pick and place machine. However, the present disclosure is not limited thereto.

Figure 11:
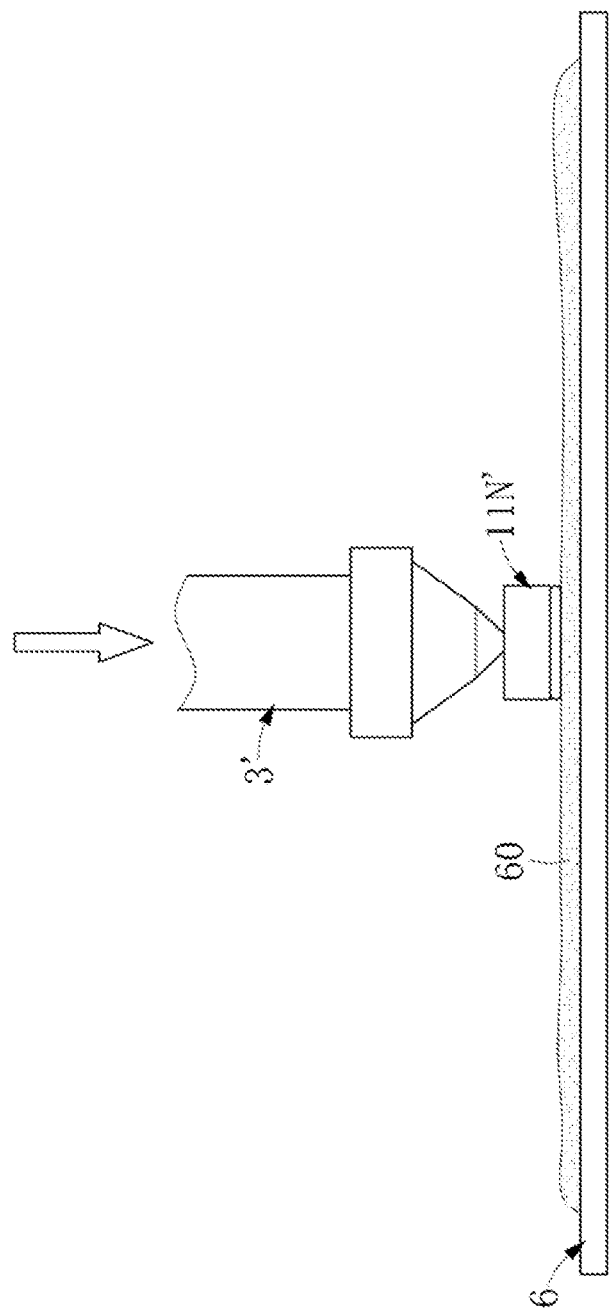
FIG. 11 is a schematic view of a step S206 of the method for repairing a light-emitting device according to the second embodiment of the present disclosure.

Next, as shown in FIG. 9 and FIG. 11, a volatile adhesive material 60 is formed on the bottom of the good light-emitting unit 11N' (step S206). For example, a volatile adhesive material 60 may be stored through a volatile adhesive material storage module 6 (e.g., a substrate, but not limited thereto), and the volatile adhesive material 60 may be a volatile adhesive, a volatile adhesive aid, a flux, or a volatile adhesion aid or flux with solder, but is not limited thereto. Next, the obtained good light-emitting unit 11N' is brought into contact with the volatile adhesive material 60 on the volatile adhesive material storage module 6 by the pick and place module 3' so that the volatile adhesive material 60 is formed on the bottom of the good light-emitting unit 11N'. However, the present disclosure is not limited thereto.

Figure 12:
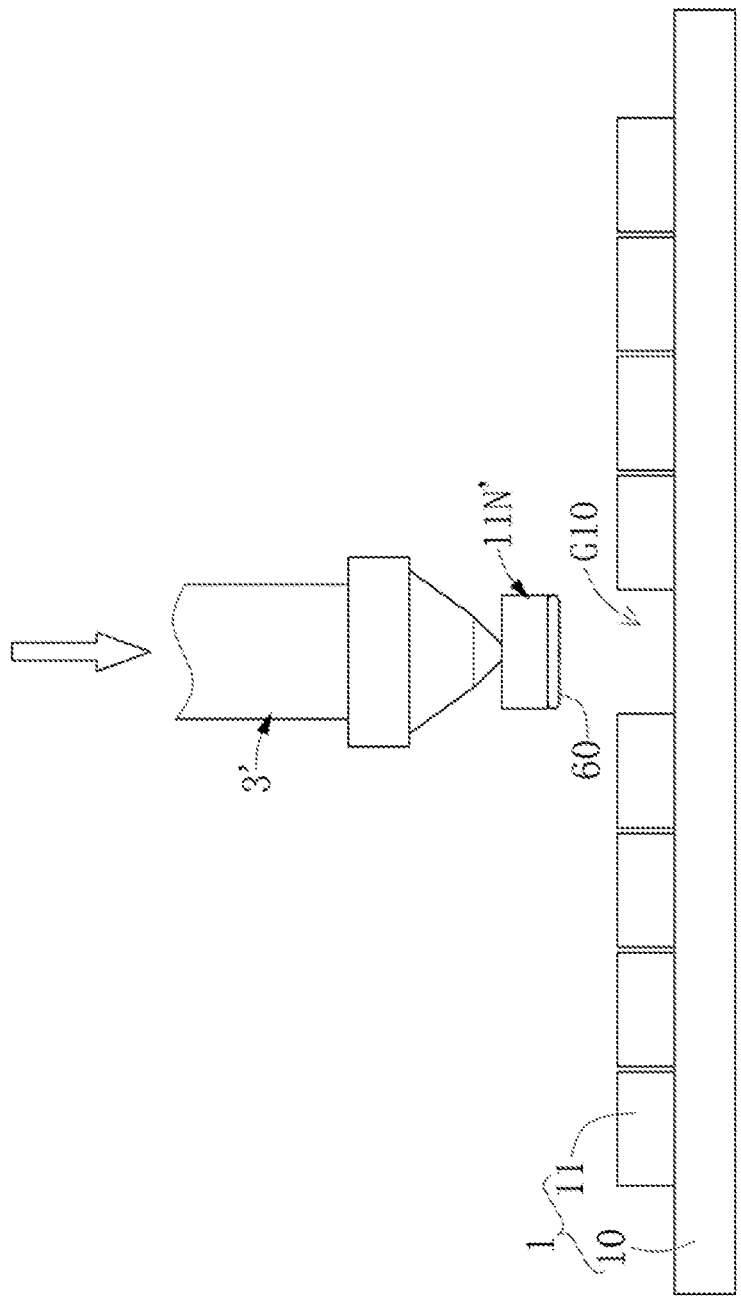
FIG. 12 is a schematic view of a step S208 of the method for repairing a light-emitting device according to the second embodiment of the present disclosure.

Then, as shown in FIG. 9 and FIG. 12, the good light-emitting unit 11N' is adhered to the unoccupied position G10 by using the volatile adhesive material 60 (step S208). For example, after forming the volatile adhesive material 60 on the bottom of the good light-emitting unit 11N', the good light-emitting unit 11N' is placed on the unoccupied position G10 on the circuit substrate 10 by using the pick and place module 3' so that the good light-emitting unit 11N' is adhered to the unoccupied position G10 by the volatile adhesive material 60. However, the present disclosure is not limited thereto.

Figure 13:
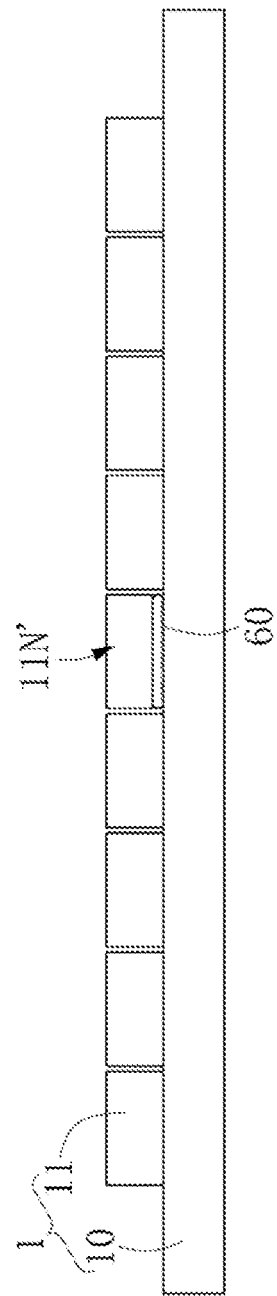
FIG. 13 is a first schematic view of a step S210 of the method for repairing a light-emitting device according to the second embodiment of the present disclosure.

Finally, as shown in FIG. 9 and FIG. 13, the good light-emitting unit 11N' is heated so that the good light-emitting unit 11N' is fixed onto the unoccupied position G10 (step S210). For example, after the good light-emitting unit 11N is adhered to the unoccupied position G10 of the circuit substrate 10, the good light-emitting unit 11N' may be heated by a tin furnace (not shown) so that the good light-emitting unit 11N' is fixed onto the unoccupied position G10 via a conductive joint S (as shown in FIG. 14) and is electrically connected to the circuit substrate 10 through the conductive joint S.

Figure 14:
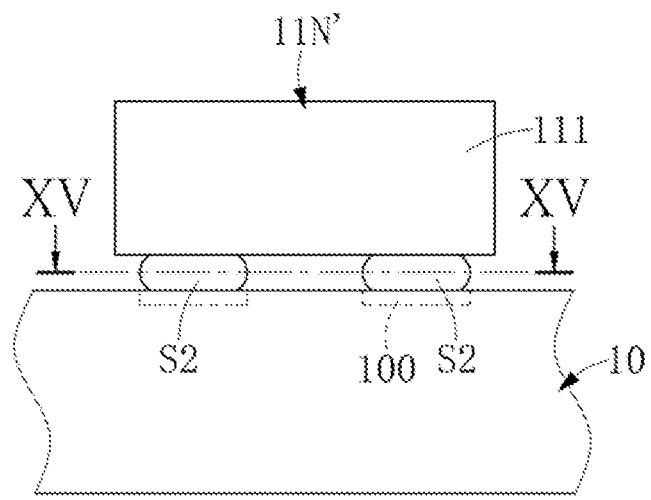
FIG. 14 is a second schematic view of the step S210 of the method for repairing a light-emitting device according to the second embodiment of the present disclosure.
Figure 15:
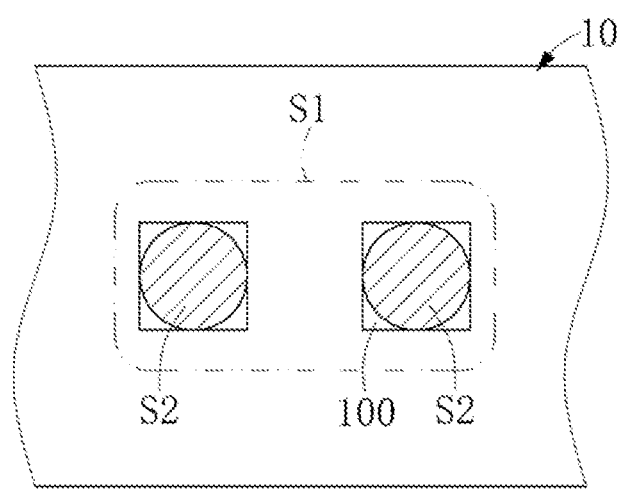
FIG. 15 is a third schematic view of the step S210 of the method for repairing a light-emitting device according to the second embodiment of the present disclosure.
Figure 16:
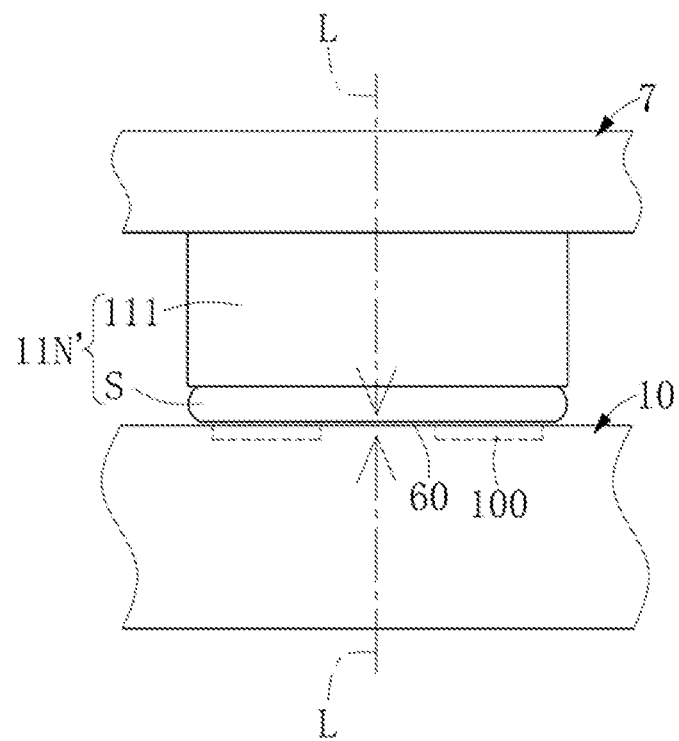
FIG. 16 is a fourth schematic view of the step S210 of the method for repairing a light-emitting device according to the second embodiment of the present disclosure.
Figure 17:
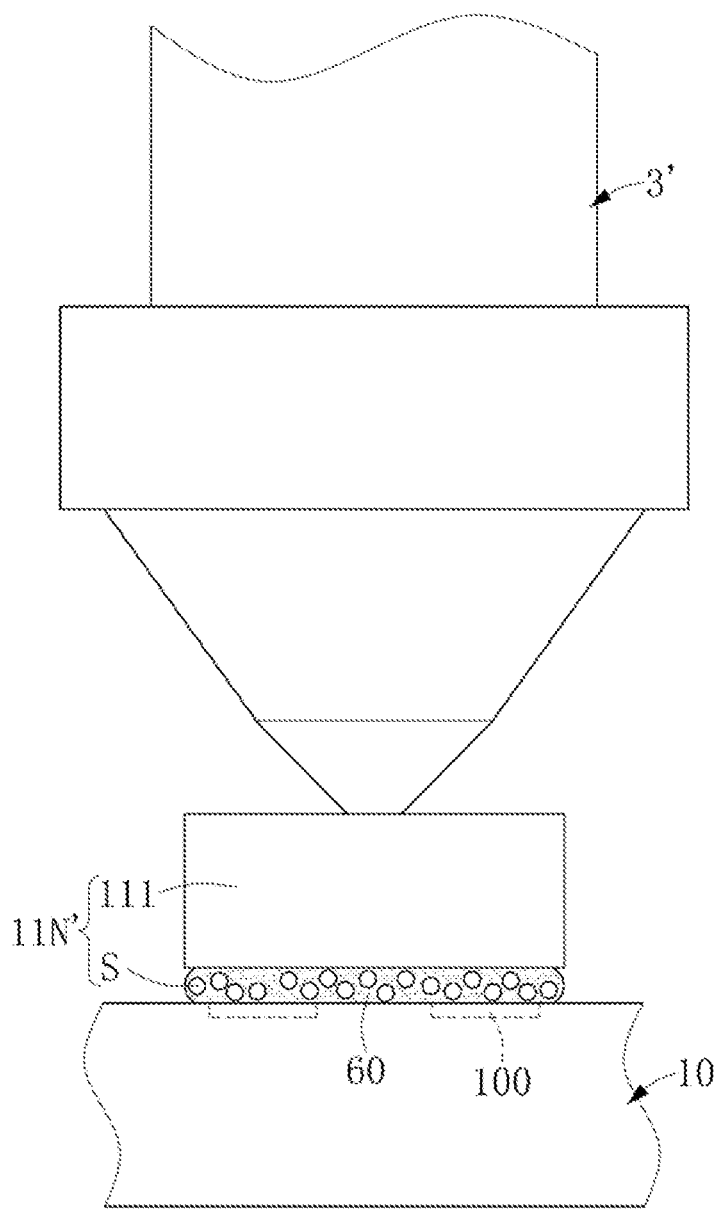
FIG. 17 is another schematic view of the step S206 to the step S208 of the method for repairing a light-emitting device according to the second embodiment of the present disclosure.

Further, as shown in FIG. 13 to FIG. 15, the circuit substrate 10 has a plurality of pad areas 100 and a non-pad area different therefrom. The material of the pad area 100 may include aluminum, gold or other metals and alloys. When the conductive joint S1 on the bottom of the good light-emitting unit 11N' (as shown in FIG. 15) is in a molten state, the conductive joint S above the non-pad area of the circuit substrate 10 moves toward the adjacent pad area 100 due to cohesive force, so that the thickness of the conductive joint S on the non-pad area is gradually thinned. Finally, the conductive joints S above the non-pad area will all move to be above the adjacent pad area 100, so that the non-pad area will be exposed, and the conductive joint S2 above each pad area 100 will form a ball (as shown in FIG. 14). After the conductive joint S2 is cooled and solidified, a solder ball is formed on each of the pad areas 100. It should be noted that the solder balls and different conductive joints may be selected depending on the components to be joined. For example, common solder balls may include the following types: an ordinary solder ball (the atomic percentage of tin is 2% to 100%, the melting point ranges from 180° C. to 316° C.), a low-temperature solder ball (including antimony or indium, the melting point ranges from 95° C. to 135° C.), a high temperature solder ball (melting point ranges from 186° C. to 309° C.), a fatigue-resistant high-purity solder ball (melting point ranges from 178° C. to 183° C.) and a lead-free solder ball (the atomic percentage of lead in the composition is less than 0.1%). However, the present disclosure is not limited thereto.

It should be noted that, as shown in FIG. 11 and FIG. 7, the second embodiment of the present disclosure further provides an apparatus for repairing a damaged light-emitting unit, which is slightly similar to the apparatus for repairing a damaged light-emitting unit Z of the first embodiment, thus similar component operations will not be described again. Further, the difference between the second embodiment of the present disclosure and the first embodiment is that the apparatus for repairing a damaged light-emitting unit of the present embodiment further includes a volatile adhesive material storage module 6, which may be used for accommodating and storing the volatile adhesive material 60.

Further, in conjunction with FIG. 9 to FIG. 16, step S210 of the second embodiment of the present disclosure further includes abutting the good light-emitting unit 11N' by a pressing board 7. For example, after the good light-emitting unit 11N' is adhered to the unoccupied position G10 of the circuit substrate 10, the good light-emitting unit 11N' may be abutted by the pressing board 7 so that the good light-emitting unit 11N' is firmly in contact with the circuit substrate 10. Next, the energy source L is directed to the conductive joint S of the good light-emitting unit 11N' so that the good light-emitting unit 11N' is fixed onto the unoccupied position G10 (as shown in FIG. 14) and electrically connected to the circuit substrate 10. The energy source L may be generated by the energy generating module 2. However, the present disclosure is not limited thereto.

In addition, as shown in FIG. 9 to FIG. 17, steps S206 to S208 of the second embodiment of the present disclosure may further include forming a volatile adhesive material 60 on the bottom of the good light-emitting unit 11N', and the conductive joint S is mixed with the volatile adhesive material 60. The volatile adhesive material 60 is used to adhere the good light-emitting unit 11N' to the unoccupied position G10. That is, the good light-emitting unit 11N' preloaded by the carrier board 5 may include an LED chip 111, and the volatile adhesive material 60 stored in the volatile adhesive material storage module 6 is mixed with the conductive joint S. Therefore, after the volatile adhesive material 60 including the conductive joint S is formed on the bottom of the good light-emitting unit 11N', the good light-emitting unit 11N' may be fixed onto the unoccupied position G10 through the conductive joint S by the above steps S208 and S210 (as shown in FIG. 14) and electrically connected to the circuit substrate 10 through the conductive joint S. After the conductive joint S is cooled and solidified, solder balls are formed on each of the pad areas 100. However, the present disclosure is not limited thereto.

It should be noted that, in the above-mentioned embodiment, the apparatus for repairing a damaged light-emitting unit may further include an image capturing module (not shown) and a processing module (not shown). The method for repairing a damaged light-emitting unit in a light-emitting device may further include the step of positioning and/or calculating position through the image capturing module and/or the processing module of the apparatus. As such, the pick and place module 3' may be used to remove the damaged light-emitting unit 11B on the circuit substrate 10, obtain the good light-emitting unit 11N' on the carrier board 5, and/or place the good light-emitting unit 11N' on the unoccupied position G10 on the circuit substrate 10 more precisely. Optionally, the position detecting module 4 may be used integrally or individually for positioning and/or calculating position.

In an embodiment, the above-mentioned method may be a portion of a manufacturing process of an LED panel. For example, the circuit substrate 10 may be a thin film transistor (TFT) array substrate, and the LED chip 111 may be a red LED, a green LED or a blue LED, but the disclosure is not limited thereto.

In an embodiment, a manufacturing process of an LED panel including the following steps is provided: providing a circuit substrate and a plurality of LED chips; applying a flux onto the circuit substrate; and using a volatile adhesive material to affix the plurality of LED chips onto the circuit substrate. If one of the aforementioned LED chips disposed on the circuit substrate is a damaged LED chip, the LED panel may optionally be repaired through the aforementioned method.

In an embodiment, the volatile adhesive material used in the manufacturing process of the LED panel (e.g., including the optionally repaired step) is the same.

In conclusion, one of the beneficial effects of the present disclosure is that the method for repairing a light-emitting device has the technical features of "using a pick and place module 3' to obtain a good light-emitting unit N' from a carrier board 5," "forming a volatile adhesive material 60 on the bottom of the good light-emitting unit N'," "using the volatile adhesive material 60 to adhere the good light-emitting unit N' to the unoccupied position G10" and "heating the good light-emitting unit N', so that the good light-emitting unit N' is fixed onto the unoccupied position G10," so that the damaged light-emitting unit 11B may be replaced by the good light-emitting unit 11N' to achieve the effect of repairing.

Another beneficial effect of the present disclosure is that the method for repairing a light-emitting device has the technical features of "directing an energy source L generated by an energy generating module 2 to the damaged light-emitting unit 11B to reduce the bonding force between the damaged light-emitting unit 11B and the circuit substrate 10," "removing a damaged light-emitting unit 11B from the circuit substrate 10 to form an unoccupied space G10 by a pick and place module 3," "placing a good light-emitting unit 11N into the unoccupied space G10 by the pick and place module 3," and "electrically connecting the good light-emitting unit 11N to the circuit substrate 10," so that the damaged light-emitting unit 11B may be replaced by the good light-emitting unit 11N to achieve the effect of repairing.

Still another beneficial effect of the present disclosure is that the apparatus for repairing a damaged light-emitting unit Z has the technical features of "the energy generating module 2 being adjacent to the circuit substrate 10 and disposed under the circuit substrate 10 for generating an energy source L" and "the pick and place module 3 being adjacent to the light-emitting unit 11 and disposed above the light-emitting unit 11," so that the energy source L generated by the energy generating module 2 is directed to the damaged light-emitting unit 11B to reduce the bonding force between the damaged light-emitting unit 11B and the circuit substrate 10, and to remove the damaged light-emitting unit 11B from the circuit substrate 10 by the pick and place module 3 to form an unoccupied space G10. Thereby, since the pick and place module 3 places a good light-emitting unit 11N into the unoccupied space G10, the damaged light-emitting unit 11B may be replaced by the good light-emitting unit 11N to achieve the effect of repairing.

Further, the damaged light-emitting unit 11B on the circuit substrate 10 may be removed and replaced with the good light-emitting unit 11N by using the method for repairing a light-emitting device and the apparatus for repairing a damaged light-emitting unit provided by the first embodiment and the second embodiment of the present disclosure, thereby achieving the effect of repairing.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. For example, the above-mentioned method may be applied to repairing a semiconductor device (e.g., a die, a chip, an integrated circuit (IC), etc.), and may be applied to manufacturing any suitable electronic product.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for repairing a light-emitting device, which comprises a plurality of light-emitting units disposed on a circuit substrate with at least one of the plurality of light-emitting units being damaged, comprising:
    removing the at least one damaged light-emitting unit from the circuit substrate to form an unoccupied position on the circuit substrate;
    providing a good light-emitting unit on a bottom of which a first volatile adhesive material has been applied;
    using a pick and place module to place the good light-emitting unit at the unoccupied position on the circuit substrate; and
    melting and solidifying the first volatile adhesive material so that the good light-emitting unit is affixed at the unoccupied position.

2. The method of claim 1, wherein the first volatile adhesive material comprises a solder and a flux.

3. The method of claim 1, wherein the light-emitting unit is an LED chip.

4. A method for manufacturing an LED panel, comprising:
    providing a circuit substrate and a plurality of LED chips, wherein at least one of the plurality of LED chips being damaged;
    applying a flux onto the circuit substrate;
    using a second volatile adhesive material to affix the plurality of LED chips onto the circuit substrate; and
    repairing the LED panel further comprising:
    removing the at least one damaged LED chip from the circuit substrate to form an unoccupied position on the circuit substrate;
    providing a good LED chip on a bottom of which a first volatile adhesive material has been applied;
    using a pick and place module to place the good LED chip at the unoccupied position on the circuit substrate; and
    melting and solidifying the first volatile adhesive material so that the good LED chip is affixed at the unoccupied position.

5. The method of claim 4, wherein the second volatile adhesive material is applied onto a bottom of the plurality of LED chips.

6. The method of claim 4, wherein the second volatile adhesive material is applied onto the circuit substrate.

7. The method of claim 4, wherein the second volatile adhesive material comprises a solder.

8. The method of claim 4, wherein the second volatile adhesive material comprises a flux.

9. The method of claim 4, wherein the first volatile adhesive material and the second volatile adhesive material are the same material.

* * * * *